(12) United States Patent
Hayashi et al.

(10) Patent No.: US 7,652,368 B2
(45) Date of Patent: *Jan. 26, 2010

(54) SEMICONDUCTOR DEVICE

(75) Inventors: Yoshinari Hayashi, Fuchu (JP);
Toshikazu Ishikawa, Kodaira (JP);
Takayuki Hoshino, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 236 days.

This patent is subject to a terminal disclaimer.

(21) Appl. No.: 11/946,581

(22) Filed: Nov. 28, 2007

(65) Prior Publication Data

US 2008/0083978 A1 Apr. 10, 2008

Related U.S. Application Data

(63) Continuation of application No. 11/221,904, filed on Sep. 9, 2005, now Pat. No. 7,323,773.

(30) Foreign Application Priority Data

Sep. 21, 2004 (JP) .............................. 2004-273024

(51) Int. Cl.
*H01L 21/58* (2006.01)
(52) U.S. Cl. ............... 257/698; 257/777; 257/E21.513; 257/E25.03; 257/E23.062; 257/E23.067
(58) Field of Classification Search ................ 257/698, 257/777, E21.513, E25.03, E23.062, E23.067
See application file for complete search history.

(56) References Cited

U.S. PATENT DOCUMENTS

| | | | | |
|---|---|---|---|---|
| 5,703,405 A | * | 12/1997 | Zeber ......................... | 257/777 |
| 5,973,403 A | * | 10/1999 | Wark .......................... | 257/777 |
| 6,100,594 A | * | 8/2000 | Fukui et al. .................. | 257/777 |
| 6,133,629 A | * | 10/2000 | Han et al. .................... | 257/698 |
| 6,181,002 B1 | * | 1/2001 | Juso et al. .................... | 257/686 |
| 6,229,217 B1 | * | 5/2001 | Fukui et al. .................. | 257/777 |
| 6,512,302 B2 | * | 1/2003 | Mess et al. ................... | 257/777 |
| 6,768,190 B2 | * | 7/2004 | Yang et al. .................... | 257/686 |
| 6,768,207 B2 | * | 7/2004 | Tao et al. ..................... | 257/777 |
| 6,873,036 B2 | * | 3/2005 | Akram ........................ | 257/686 |

(Continued)

FOREIGN PATENT DOCUMENTS

JP 10-12809 1/1998

(Continued)

*Primary Examiner*—George Fourson
(74) *Attorney, Agent, or Firm*—Antonelli, Terry, Stout & Kraus, LLP.

(57) ABSTRACT

A semiconductor device having a first semiconductor chip with an SDRAM and a second semiconductor chip with a an MPU controlling the SDRAM. The contour size of the semiconductor device is reduced to a smaller size without impairing the testability of the first semiconductor chip. The two semiconductor chips are stacked over the top surface of an interconnect substrate and sealed in a molding resin, thus forming an SiP (System-in-Package). First terminals electrically connected with the second chip are arranged as external terminals of the SiP on the outer periphery of the bottom surface of the interconnect substrate. Plural second electrodes electrically connected with interconnects, which electrically connect the two chips, are mounted as terminals for testing of the SDRAM. The second electrodes are located more inwardly than the innermost row of the first external electrodes on the bottom surface of the interconnect substrate.

4 Claims, 14 Drawing Sheets

U.S. PATENT DOCUMENTS

| | | | |
|---|---|---|---|
| 6,885,106 B1 * | 4/2005 | Damberg et al. | 257/777 |
| RE38,806 E * | 10/2005 | Fukui et al. | 257/777 |
| 6,960,827 B2 | 11/2005 | Nishimura et al. | |
| 7,042,073 B2 * | 5/2006 | Kado et al. | 257/678 |
| 7,071,569 B2 * | 7/2006 | Ho et al. | 257/778 |
| 7,112,878 B2 * | 9/2006 | Akram | 257/686 |
| 7,332,820 B2 * | 2/2008 | Tan et al. | 257/777 |
| 2001/0013653 A1 | 8/2001 | Shoji | |
| 2003/0111737 A1 * | 6/2003 | Katagiri et al. | 257/777 |
| 2004/0036170 A1 | 2/2004 | Lee et al. | |
| 2004/0130036 A1 * | 7/2004 | Owaki et al. | 257/777 |
| 2004/0235287 A1 | 11/2004 | Inoue et al. | |
| 2005/0173807 A1 * | 8/2005 | Zhu et al. | 257/777 |
| 2008/0296697 A1 * | 12/2008 | Hsu et al. | 257/379 |

FOREIGN PATENT DOCUMENTS

| | | |
|---|---|---|
| JP | 2004-022664 | 1/2004 |
| WO | WO 02/103793 | 12/2002 |

\* cited by examiner

FIG. 6

| Pad No. | Pad name |
|---|---|
| 1 | VSS |
| 2 | VDD |
| 3 | DQ0 |
| 4 | VDDQ |
| 5 | DQ1 |
| 6 | DQ2 |
| 7 | VSSQ |
| 8 | DQ3 |
| 9 | DQ4 |
| 10 | VDDQ |
| 11 | DQ5 |
| 12 | DQ6 |
| 13 | VSSQ |
| 14 | DQ7 |
| 15 | NC |
| 16 | VDDQ |
| 17 | VSS |
| 18 | NC |
| 19 | VSS |
| 20 | VDD |
| 21 | NC |
| 22 | VSS |
| 23 | VSSQ |
| 24 | NC |
| 25 | DQ8 |
| 26 | VDDQ |
| 27 | DQ9 |
| 28 | DQ10 |
| 29 | VSSQ |
| 30 | DQ11 |
| 31 | DQ12 |
| 32 | VDDQ |
| 33 | DQ13 |
| 34 | DQ14 |
| 35 | VSSQ |
| 36 | DQ15 |
| 37 | VDD |
| 38 | VSS |
| 39 | VSS |
| 40 | VDD |

| Pad No. | Pad name |
|---|---|
| 41 | NC |
| 42 | NC |
| 43 | A3 |
| 44 | A2 |
| 45 | A1 |
| 46 | A0 |
| 47 | A10 |
| 48 | BA1 |
| 49 | BA0 |
| 50 | CSB |
| 51 | RASB |
| 52 | CASB |
| 53 | WEB |
| 54 | NC |
| 55 | NC |
| 56 | NC |
| 57 | LDQM |
| 58 | VSS |
| 59 | NC |
| 60 | VSS |
| 61 | VSS |
| 62 | VDD |
| 63 | VDD |
| 64 | NC |
| 65 | VSS |
| 66 | UDQM |
| 67 | NC |
| 68 | NC |
| 69 | CLK |
| 70 | CKE |
| 71 | A11 |
| 72 | A9 |
| 73 | A8 |
| 74 | A7 |
| 75 | A6 |
| 76 | A5 |
| 77 | A4 |
| 78 | NC |
| 79 | NC |
| 80 | VDD |
| 81 | VSS |

SEMICONDUCTOR DEVICE

CROSS-REFERENCE TO RELATED APPLICATION

This application is a continuation of U.S. application Ser. No. 11/221,904, filed Sep. 9, 2005, now U.S. Pat. No. 7,323, 773 and which application claims priority from Japanese patent application No. 2004-273024, filed on Sep. 21, 2004, the contents of which are hereby incorporated by reference into this application.

BACKGROUND OF THE INVENTION

1. Field of the Invention

The present invention relates to semiconductor device technology and, more particularly, to a technique that is effectively applied to a semiconductor device in the form of a System-in-Package (SiP) comprising a desired circuit system built within a package. The circuit system uses a semiconductor chip having a memory circuit and another semiconductor chip having a circuit that controls the memory circuit.

2. Description of the Related Art

We have discussed a System-in-Package (SiP) comprising a package in which both a semiconductor chip having a microcomputer and another semiconductor chip having a synchronous DRAM (synchronous dynamic random access memory; abbreviated SDRAM) are incorporated. The microcomputer and SDRAM are electrically connected together within the package. The output terminals of the microcomputer including address and data terminals and the output terminals of the SDRAM including address and data terminals are brought out as external terminals to the outside of the package from the rear surface of the interconnect substrate forming the SiP. The external terminals of the SDRAM are used as testing external terminals for performing evaluation (debugging), reliability test, and defect analysis and thus regarded as important terminals.

An SiP of this kind is described, for example, in WO 02/103793, where there is disclosed a technique using a test pin disposed in the center of the rear surface of the substrate of the package of the SiP to switch the test mode. A first semiconductor chip having a DRAM and mounted on the main surface of the package substrate, a second semiconductor chip having a flash memory, and a third semiconductor chip having a microprocessor are sealed within the same package (see Patent Reference 1).

Furthermore, a multichip module having a package substrate and a testing conductive pad disposed in the center of the rear surface of the substrate is disclosed, for example, in JP-A-10-12809 (see Patent Reference 2).

In addition, a structure including testing terminals having no solder bumps is disclosed, for example, in JP-A-2004-22664. The testing terminals are arranged between external interconnect terminals that are disposed like lattices on the rear surface of a package substrate (see Patent Reference 3).

However, we have discovered that the above-described SiP has the following problem. Today, SiPs have been increasingly required to decrease in contour size. However, as more functions have been required, the number of external terminals tends to increase. Under these circumstances, it has been become more difficult to secure an area on which the external terminals are disposed. This makes it impossible to reduce the contour size of an SiP down to a contour size required by a client. To achieve the SiP of the required contour size, it is urged to omit the testing external terminals of the SDRAM. If the testing external terminals are simply omitted, there arises the problem that detailed evaluation, reliability test, and defect analysis of the SDRAM cannot be performed.

SUMMARY OF THE INVENTION

It is an object of the present invention to provide a technique of reducing the contour size of a semiconductor device including a first semiconductor chip having a memory circuit and a second semiconductor chip having a circuit controlling the memory circuit down to a size required by a client without impairing the testability of the first semiconductor chip having the memory circuit.

The foregoing and other objects and novel features of the present invention will become apparent from the description of the present specification and accompanying drawings.

An outline of a typical one of the aspects of the invention disclosed herein is briefly described below.

A semiconductor device according to this typical aspect comprises: an interconnect substrate having first and second main surfaces on opposite sides; a first semiconductor chip having a memory circuit mounted on the first main surface of the interconnect substrate; a second semiconductor chip mounted on the first main surface of the interconnect substrate and having a circuit controlling the memory circuit; and a sealing body that seals the first and second semiconductor chips. The memory circuit and the circuit controlling the memory circuit together form a desired system. Plural rows of first external terminals electrically connected with the second semiconductor chip are arranged on an outer periphery of the second main surface of the interconnect substrate. Plural second external terminals are electrically connected with interconnects within the interconnect substrate which electrically connect the first and second semiconductor chips. The second external terminals are arranged in an area that is located more inwardly than, and spaced from, the innermost row of the first external terminals by a distance equal to or greater than the spacing between the adjacent rows of the first external terminals.

The typical aspect of the invention disclosed herein yields advantages, which will be described briefly below.

The semiconductor device comprises: the interconnect substrate having the first and second main surfaces on the opposite sides; the first semiconductor chip mounted on the first main surface of the interconnect substrate and having the memory circuit; the second semiconductor chip mounted on the first main surface of the interconnect substrate and having the circuit controlling the memory circuit; and the sealing body that seals the first and second semiconductor chips. The memory circuit and the circuit controlling it together form a desired system. The plural rows of the first external terminals electrically connected with the second semiconductor chip are arranged on the outer periphery of the second main surface of the interconnect substrate. The second external terminals are electrically connected with the interconnects within the interconnect substrate which electrically connect the first and second semiconductor chips. The second external terminals are arranged in the inside area that is located more inwardly than, and spaced from, the innermost row of the first external terminals by a distance equal to or greater than the spacing between the adjacent rows of the first external terminals. Consequently, the contour size of the semiconductor device can be reduced down to a size required by a client without impairing the testability of the first semiconductor chip having the memory circuit.

In the following embodiments, in a case where there is a need for convenience, the present invention is described using plural sections or separate embodiments. Except for specifically stated, they are not unrelated to each other. Rather, one has a relation, such as modification, detailed version, or complementary explanation, to a part or all of the other. Furthermore, in the following embodiments, in a case where the number of components, their numerical values, amounts of them, their ranges, and so on are mentioned, the invention is not limited to such certain values, amounts, ranges, or the like unless specifically stated or except for cases where the invention is limited in principle to clearly certain numerical values. Numerical values greater or smaller than the certain numerical values may be permitted. In addition, it is obvious that in the following embodiments, the constituent elements of the invention including elements, process steps, and so on are not always essential except for explicitly stated cases or except in cases where they are clearly essential in principle. Similarly, in the following embodiments, when the shape of the constituent elements, their positional relationship, or the like is mentioned, the invention substantially embraces ones which are close or similar to the shape except for explicitly stated cases or in cases where it is thought that they are obviously not true in principle. This also applies to the foregoing numerical values and ranges. In all the figures for illustrating the embodiments, identical numerals or symbols are given to those having identical functions. The repeated explanation is omitted as much as possible. Embodiments of the present invention are hereinafter described in detail with reference to the drawings.

BRIEF DESCRIPTION OF THE DRAWINGS

FIG. 6 is a table illustrating the numbers given to the terminals of the first semiconductor chip of FIG. 5 and their names;

DESCRIPTION OF THE PREFERRED EMBODIMENTS

Embodiment 1

Figure 1:
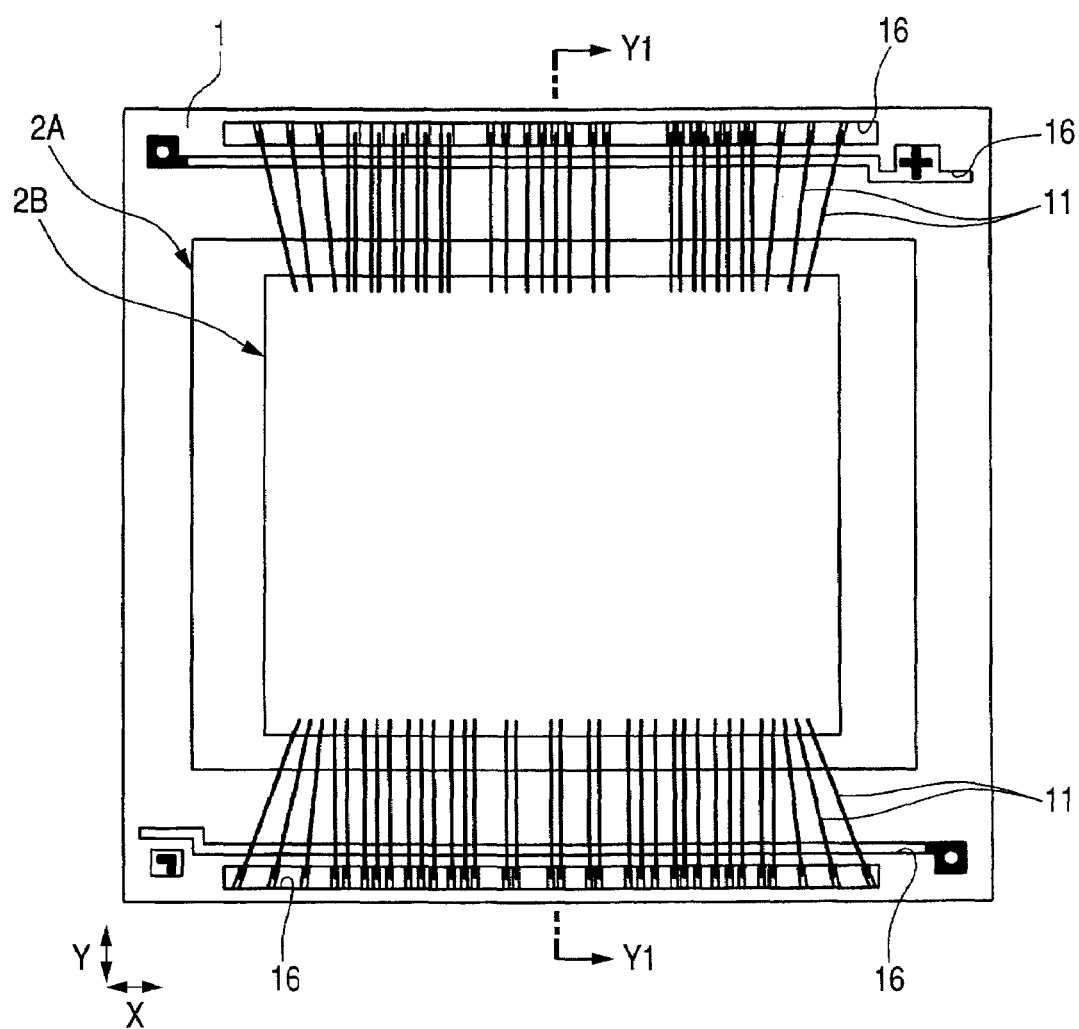
FIG. 1 is a plan view of the top surface (first main surface) of an interconnect substrate, showing the internal structure of a semiconductor device that is one embodiment of the present invention.
Figure 2:
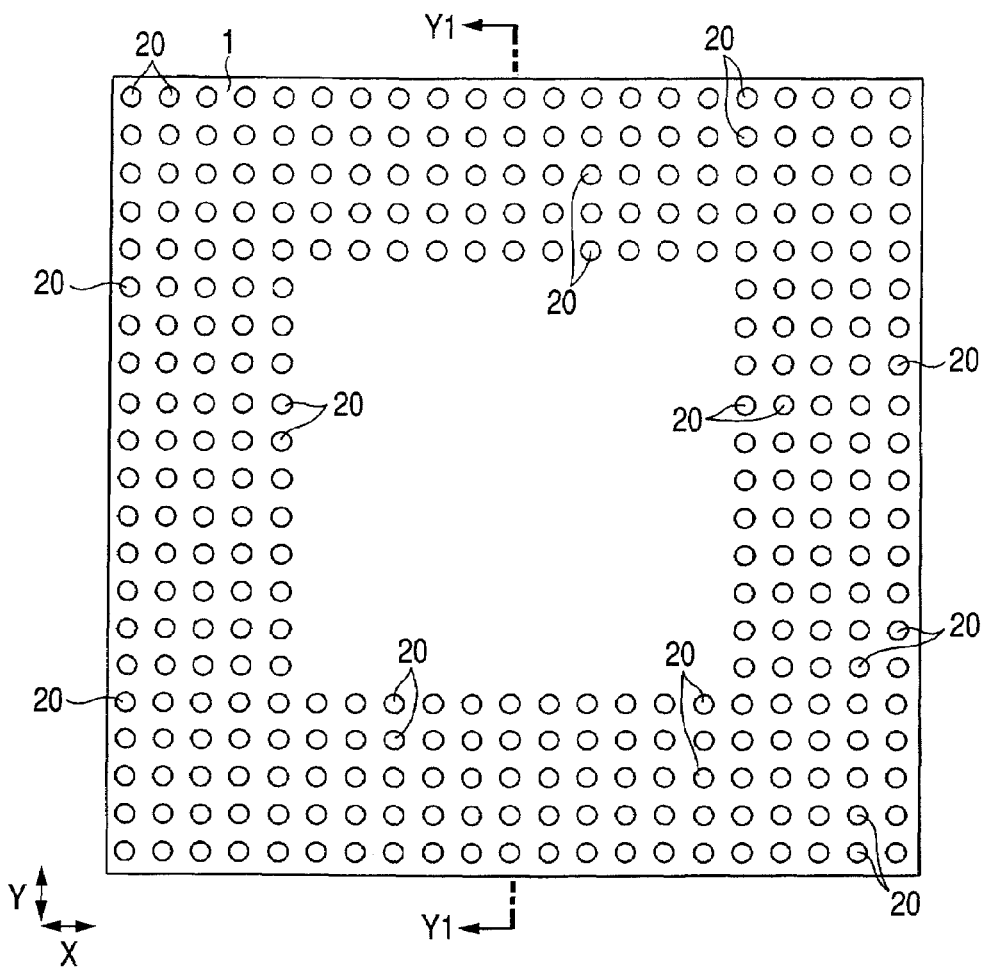
FIG. 2 is a plan view of the bottom surface (second main surface) of the interconnect substrate of the semiconductor device shown in FIG. 1.
Figure 3:
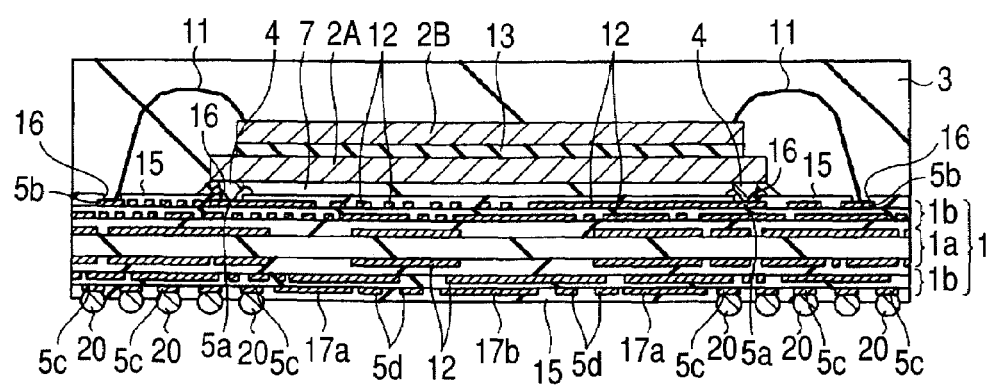
FIG. 3 is a cross-sectional view taken on line Y1-Y1 of FIGS. 1 and 2.
Figure 4:
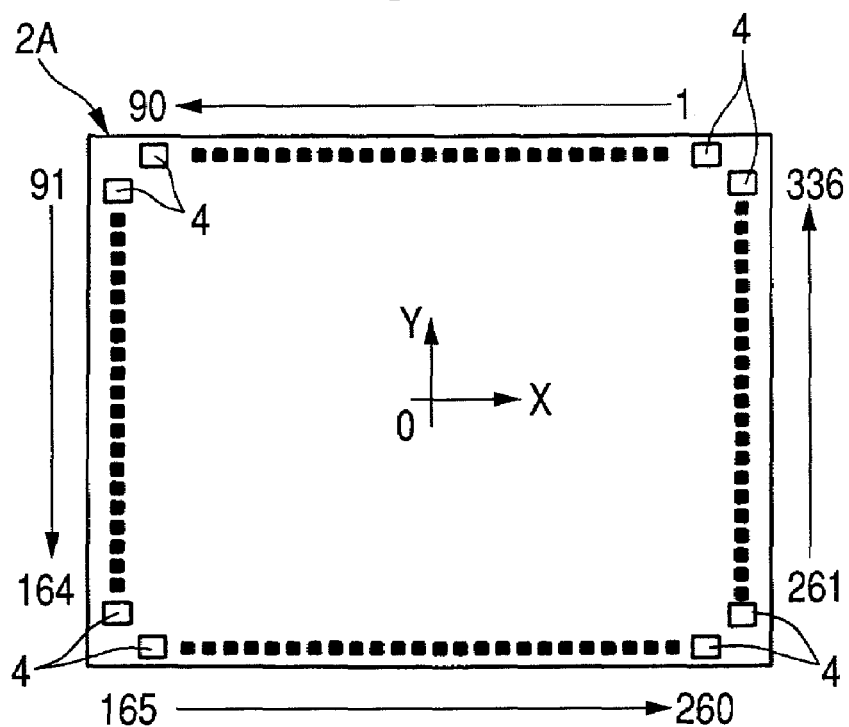
FIG. 4 is a plan view of the main surface of a second semiconductor chip of the semiconductor device shown in FIG. 1.
Figure 5:
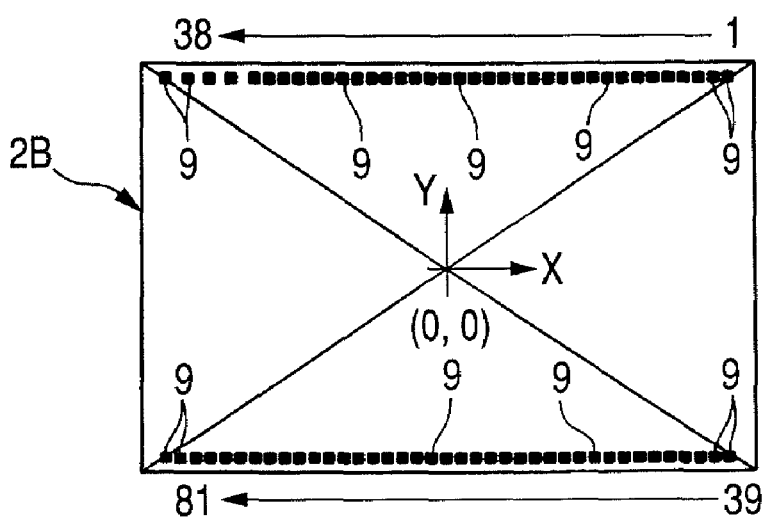
FIG. 5 is a plan view of the main surface of a first semiconductor chip of the semiconductor device shown in FIG. 1.
Figure 7:
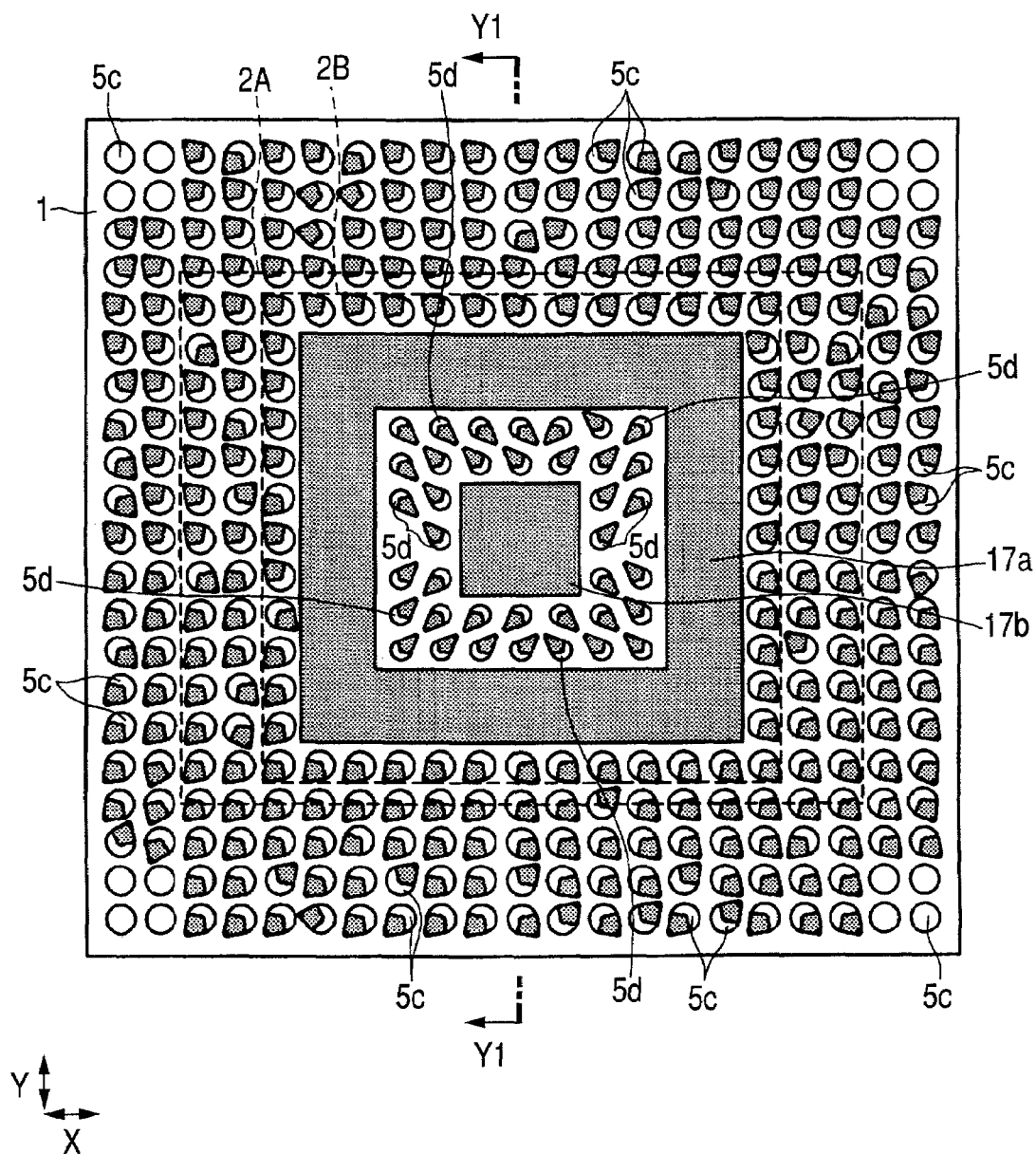
FIG. 7 is a plan view of the lowermost interconnect layer (second main surface) of the interconnect substrate of the semiconductor device shown in FIG. 1.
Figure 8:
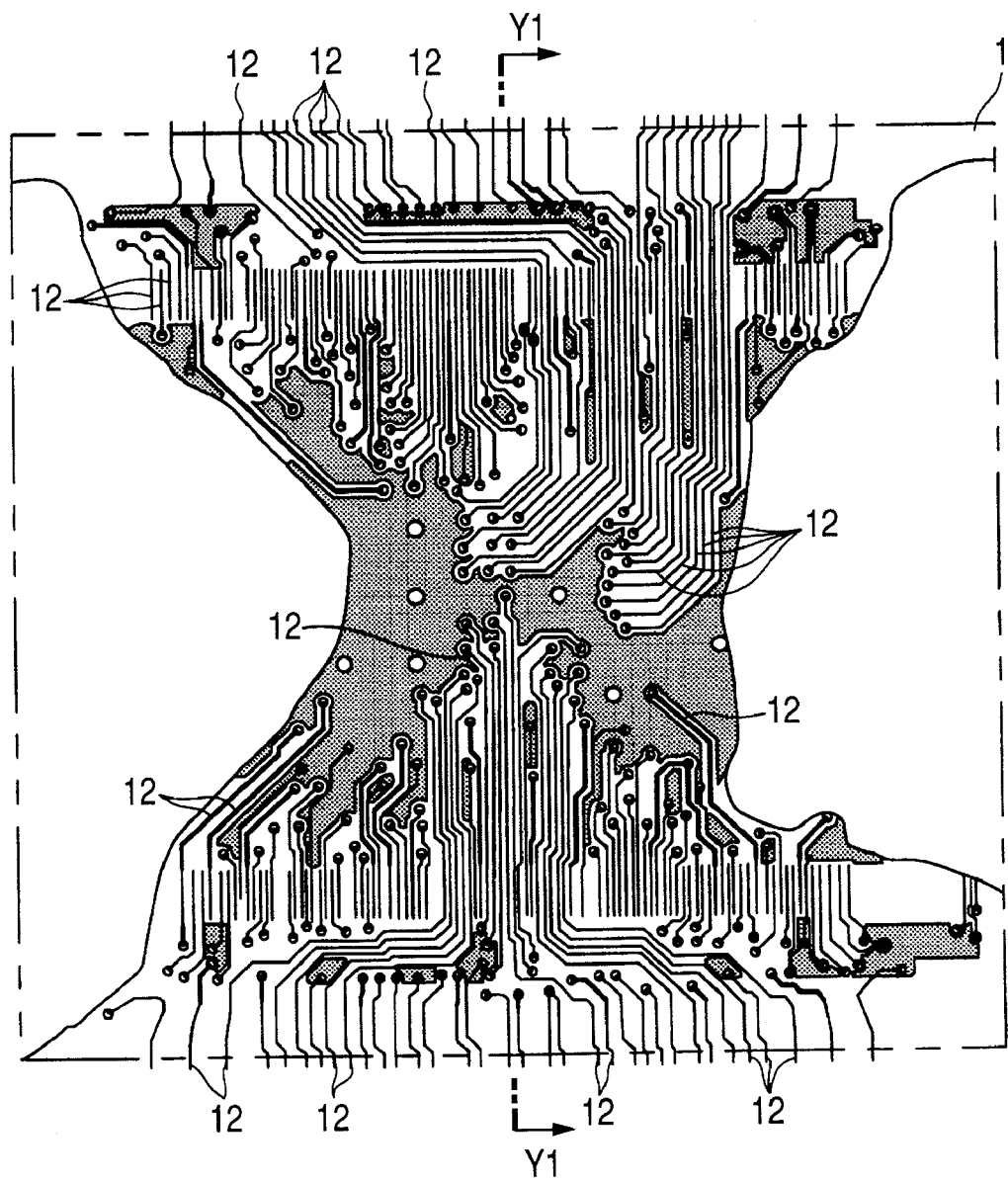
FIG. 8 is a fragmentary plan view of the top-level interconnect layer (first main surface) of the interconnect substrate of the semiconductor device shown in FIG. 1.

FIG. 1 is a plan view of the top plane (first main surface) of an interconnect substrate showing the internal structure of a semiconductor device of the present embodiment. FIG. 2 is a plan view of the bottom plane (second main surface) of the interconnect device of the semiconductor device shown in FIG. 1. FIG. 3 is a cross-sectional view taken on line Y1-Y1 of FIGS. 1 and 2. FIG. 4 is a plan view of a main surface of a second semiconductor chip of the semiconductor device shown in FIG. 1. FIG. 5 is a plan view of a main plane of a first semiconductor chip of the semiconductor device shown in FIG. 1. FIG. 6 is a table illustrating numbers given to the terminals of the first semiconductor chip shown in FIG. 5, as well as the names of the terminals. FIG. 7 is a plan view of the lowermost interconnect layer (second main surface) of the interconnect substrate of the semiconductor device shown in FIG. 1. FIG. 8 is a fragmentary plan view of the top-level interconnect layer (first main plane) of the interconnect substrate of the semiconductor device shown in FIG. 1.

The semiconductor device of the present Embodiment 1 is a System-in-Package (SiP) of the stacked structure. The SiP is obtained by stacking and mounting two semiconductor chips 2A and 2B at two levels over the top surface (first main surface) of an interconnect substrate 1 and sealing the semiconductor chips 2A and 2B with molding resin 3 (sealing body).

Of the two stages of semiconductor chips 2A and 2B stacked at two levels, a high-speed microprocessor (or microprocessing unit (MPU)) having an operating frequency, for example, of 166 MHz or 133 MHz is fabricated in the lower stage of semiconductor chip (second semiconductor chip) 2A. In some cases, an A/D converter circuit and a PLL circuit may be formed in the semiconductor chip 2A, as well as the MPU. The semiconductor chip 2A has a rectangular planar form. The main surface of the chip 2A that is the bottom surface on which devices are fabricated is faced toward the upper surface of the interconnect substrate 1. Under this state, the chip is electrically connected with electrodes (second terminals) 5*a* of the interconnect substrate 1 via a plurality of solder bumps 4 formed on the main surface of the semiconductor chip 2A. The solder bumps 4 are protruding electrodes (terminals) for bringing out the electrodes of the microprocessor formed on the main surface of the semiconductor chip 2A. The solder bumps 4 are made of gold (Au), for example. The number of the bumps 4 is 336, for example, and they are arranged along the outer periphery of the main surface (bottom surface) of the semiconductor chip 2A as shown in FIG. 4, although the invention is not restricted to this structure. An underfill resin 7 is filled in the gap between the main surface (bottom surface) of the chip 2A and the top surface (first main surface) of the interconnect substrate 1. The semiconductor chip 2A in which the MPU is fabricated is mounted on the interconnect substrate 1 by flip chip bonding.

An SDRAM of 256 Mbits, for example, is formed in the upper stage of semiconductor chip (first semiconductor chip) 2B stacked on the semiconductor chip 2A. The semiconductor chip 2B has a rectangular planar form smaller than the semiconductor chip 2A described above. A plurality of bonding pads or terminals (hereinafter referred to as the pads) 9 are arranged along the two longer sides of the main surface (top surface) of the chip 2B. The pads 9 include a main interconnect material of aluminum or an aluminum alloy, for example. The number of the pads 9 is 81, for example, as shown in FIG. 5, though the invention is not limited to this configuration. The numbers "1-38" and "39-81" shown in FIG. 5 indicate numbers given to the pads 9, as well as the number of the pads. FIG. 6 shows an example of name of the pad 9 bearing each number. VSS indicates the power-supply potential (that is also known as reference potential, grounding potential, or GND and is 0 V, for example) on the lower potential side for the internal circuit. VDD indicates the power-supply potential (for example, about 3.3 V) on the higher potential side for the internal circuit. VSSQ indicates the power-supply potential on the lower potential side for the data input-output circuit, the potential being also referred to as the reference potential, grounding potential, or GND. For example, VSSQ is 0 V. VDDQ is the power-supply potential on the higher potential side for the data input-output circuit. DQ0 to DQ15 indicate data signals. A0 to A11 indicate address signals. BA0 and BA1 indicate bank select address signals. CSB indicates a chip select signal. RAS indicates a row address strobe signal. CAS indicates a column address strobe signal. WEB indicates a write enable signal. UDWM and LDQM indicate input/output mask signals. CLK indicates a clock input signal. CKE indicates a clock enable signal. NC indicates non-connection.

The pads 9 of the semiconductor chip 2B as described above are electrically connected with electrodes (first terminals) 5*b* of the interconnect substrate 1 via bonding wires 11 (hereinafter referred to as the wires) made of gold (Au), for example. That is, the semiconductor chip 2B is electrically connected with the interconnect substrate 1 by wire bonding. The electrodes 5*b* are electrically connected with the external interface of the microprocessor in the lower stage of semiconductor chip 2A through plural interconnects 12 inside the interconnect substrate 1. This semiconductor chip 2B is placed in the center of the top surface of the semiconductor chip 2A in the lower layer. The chip 2B is bonded to the top surface of the chip 2A with adhesive 13 or the like. The semiconductor chips 2A and 2B are stacked such that their centers are aligned.

The interconnect substrate 1 on which the two semiconductor chips 2A and 2B are mounted constitutes an interposer when the chips 2A and 2B are mounted on a motherboard of various mobile devices such as a cell phone. The dimensions of the interconnect substrate 1 are 10.9 mm in height×10.9 mm in width, for example. This interconnect substrate 1 is a multilayered interconnect substrate consisting mainly of a general-purpose resin such as an epoxy resin (glass epoxy resin) containing glass fibers. The interconnects 12, each of which has about 4 to 6 layers in total and connected with any one of the electrodes 5*a* and 5*b*, are formed on the top surface (first main surface) and inside of the substrate 1. Furthermore, this interconnect substrate 1 is, for example, made of a build-up interconnect substrate consisting of a base layer 1*a* and high-density interconnect layers (build-up layers) 1*b*. The base layer 1*a* is a conventional printed wiring board and sandwiched between the interconnect layers 1*b*. The base layer 1*a* is fabricated by printing upper and lower layers of interconnects 12, i.e., by stacking plural printed boards. The interconnect layers of the base layer 1*a* are appropriately electrically connected via base vias. The base vias are formed by forming through-holes by drilling and depositing a conductive film on the inner wall surface of each through-hole or burying the conductive film in the through-holes. The build-up layers 1*b* are formed by alternately laminating insulating layers consisting, for example, of polyimide resin and interconnect layers 12 on the top and lower surfaces of the base layers 1*a*. The interconnect layers of the build-up layers are also appropriately electrically connected through vias. The vias are formed by photolithography. In the build-up layers 1*b*, the pitch of the electrode interconnects and the diameter of the vias can be made smaller than the pitch of the electrode interconnects of the base layers 1*a* and the diameter of the base vias. Solder resist (insulating layer) 15 is coated on the top-level layers on the upper and lower surfaces of the interconnect substrate 1. The solder resist 15 is also known as stop-off and is a coating agent having good heat-resistance and cleaning-resistance. This coating agent does not show solder-wettability. The solder resist 15 acts also to protect the surface of the substrate from deterioration due to moisture and contaminants. The material of the solder resist 15 can be melamine resin, epoxy resin, acrylic resin, polystyrene resin, and polyimide resin. Besides, polyurethane and silicones are available. Openings 16 through which the electrodes 5*a* and 5*b* are exposed are formed in parts of the solder resist 15 in the top-level layer of the top surface of the interconnect substrate 1. In addition, openings 16 through which electrodes 5*c* (described later) are formed in parts of the solder resist 15 that is in the top-level layer of the bottom surface of the interconnect substrate 1.

As shown in FIG. 7, the plural electrodes 5*c* and 5*d* and wide conductive patterns 17*a* and 17*b* are arranged in the lowermost interconnect layer surface (second main surface) of the bottom surface of the interconnect substrate 1 as described above.

Plural rows (e.g., 5 rows) of electrodes (first external terminals) 5*c* are arranged in a side by side relation from the outer periphery of the bottom surface of the interconnect substrate 1 toward the center. The number of the electrodes 5*c* is 320, for example. Of these electrodes, four electrodes 5*c* at the four corners of the interconnect substrate 1 are not connected. The other electrodes 5*c* send and receive signals contributing to the operation of the circuit system formed within the SiP and power-supply voltage (including grounding potential). These electrodes 5*c* are electrically connected with the electrodes 5*a* on the top surface of the interconnect substrate 1 via the interconnects 12 on the substrate 1. Furthermore, the electrodes are electrically connected with the microprocessor of the semiconductor chip 2A through the solder bumps 4. Solder bumps 20 are connected with the electrodes 5c. That is, the SiP of the present Embodiment 1 has a BGA (ball grid array) structure having 320 pins, for example. The solder bumps 20 consist, for example, of lead (Pb)-tin (Sn) solder, a tin-silver based lead-free solder (such as tin-silver (Ag)-copper (Cu) solder), or a tin-copper based lead-free solder (such as tin-copper-nickel solder), and form the external terminals of the SiP. The SiP is mounted on a motherboard of various mobile devices via the solder bumps 20. The pitch between the adjacent solder bumps 20 is 0.5 mm, for example. Testing external terminals for performing evaluation (debugging) of the SDRAM of the semiconductor chip 2B, reliability test, and defect analysis are not arranged in the solder bumps 20 (electrodes 5c). Consequently, the total number of the external terminals of the SiP can be reduced and so the planar size of the interconnect substrate 1 can be reduced down to a small contour size required by the client. Furthermore, it is considered that if testing external terminals not contributing to the operation of the circuit system are present within the solder bumps 20 (electrodes 5c), the testing external terminals would hinder mounting the SiP on a motherboard, thus deteriorating the mountability of the SiP. Alternatively, designing the interconnects on the motherboard would be complicated. In contrast, in the present Embodiment 1, no testing external terminals are arranged in the solder bumps 20 (electrodes 5c) and, therefore, the mountability of the SiP can be improved. In addition, it is not necessary to take account of the testing external terminals of the SiP when the interconnects of the motherboard are designed. This can facilitate designing the interconnects on the motherboard.

However, if the external terminals for testing of the SDRAM were simply eliminated from the external terminals of the SiP, then evaluation, reliability test, and defect analysis of the SDRAM would be made impossible. This would deteriorate the testability of the SiP for the following reason. A functional test of the SDRAM and read/write tests of the memory can be carried out through the microprocessor of the semiconductor chip 2A (i.e., the SDRAM of the semiconductor chip 2B can be tested through the electrodes 5c of the SiP). However, tests regarding the frequency characteristics of the SDRAM and regarding the timing margin and detail tests or evaluations such as a defect identification test to know what memory cell or what peripheral circuit is at fault within the SDRAM cannot be performed (i.e., the SDRAM of the semiconductor chip 2B cannot be tested through the electrodes 5c of the SiP) through the microprocessor of the semiconductor chip 2A.

Accordingly, in the present Embodiment 1, plural electrodes (second external terminals) 5d capable of being used for evaluation, reliability test, and defect analysis of the SDRAM within the semiconductor chip 2B are arranged in a central region in the plane of the lowermost interconnect layer of the bottom surface of the interconnect substrate 1, the central region being spaced from the innermost row of the electrodes 5c by a distance equal to or greater than the spacing between the adjacent rows of the electrodes 5c. This enables evaluation, reliability test, and defect analysis of the SDRAM. Accordingly, the contour size of the SiP can be reduced down to a smaller size required by the client without impairing the testability of the SiP.

These electrodes 5d are arranged, for example, in two rows in a region located more inwardly than the contour of the semiconductor chip 2B. The total number of the electrodes (e.g., 38) is much smaller than the number of the electrodes 5c. The pitch between the adjacent electrodes 5d and their diameter are 0.5 mm, for example, in the same way as the electrodes 5c. The diameter of the electrodes 5d is slightly smaller than that of the electrodes 5c. The plural electrodes 5d can be disposed in the center of the bottom surface of the interconnect substrate 1, because the center of the bottom surface of the interconnect substrate 1 is an empty area because of the design of the circuit system. The electrodes 5c contributing to input and output of signals to and from an external LSI (large-scale integrated circuit) 21 are not disposed in this empty area for the following reason. If the multiplicity of electrodes 5c were arranged in the center of the bottom surface of the interconnect substrate 1, it would be difficult to bring out interconnects. This would produce the problem that the outer dimension of the interconnect substrate 1 is urged to be increased. In contrast, the electrodes 5d are terminals through which signals are not directly input or output to or from the external LSI 21 because of the design considerations of the circuit system. In addition, the total number of the electrodes 5d is smaller than the number of the electrodes 5c. The electrodes 5d can be sufficiently arranged even in the center of the bottom surface of the interconnect substrate 1 without producing the problem of bringing out interconnects.

The electrodes 5d are electrically connected with interconnects 12 within the interconnect substrate 1 that electrically connect the microprocessor of the semiconductor chip 2A and the SDRAM of the semiconductor chip 2B. That is, the electrodes 5d are electrically connected with pads 9 for various signals via the electrodes 5b on the upper surface of the interconnect substrate 1 and via the wires 11. The various signals include data signals DQ0-DQ15, address signals A0-A11, bank select address signals BA0, BA1, chip select signal CSB, row address strobe signal RAS, column address strobe signal CAS, write enable signal WEB, input/output mask signals UDWM, LDQM, clock input signal CLK, and clock enable signal CKE and exclude the power-supply potentials VSS, VDD, VSSQ, VDDQ of the semiconductor chip 2B, and non-connection NC. No solder bumps are connected with the electrodes 5d and thus the electrodes 5d are flat. That is, the electrodes 5d form a land grid array (LGA). The electrodes 5d are coated with the solder resist 15. If the electrodes 5d were exposed, the possibility that electrical shorts between the electrodes 5d and between any electrode 5d and solder bump 20 occur would be increased. Furthermore, the presence of the electrodes 5d would hinder mounting the SiP on a motherboard, deteriorating the mountability of the SiP. In addition, deterioration of the moisture resistance would be possible. In contrast, in the present Embodiment 1, the electrodes 5d are coated with the solder resist 15 to thereby prevent occurrence of the aforementioned electrical shorts. Furthermore, the mountability of the SiP can be improved. Additionally, the moisture resistance of the SiP can be improved.

When an evaluation or test of the SDRAM of the semiconductor chip 2B is performed, the solder resist 15 is partially and selectively removed, exposing the electrodes 5d. Probes are made to bear against the electrodes 5c and 5d, and then the evaluation or test is performed. However, if a distance of only one pitch (e.g., 0.5 mm) is provided between the innermost row of the electrodes 5c (row in the direction facing toward the center of the interconnect substrate 1 when the outer periphery of the substrate 1 is placed outward) and the outermost row of the electrodes 5d (row in the direction facing outward from the center of the interconnect substrate 1), the distance between the adjacent ones of the electrodes 5c and 5d is too small. Therefore, when the solder resist 15 is partially and selectively removed, there is not sufficient allowance in placing the masking layer covering the solder bumps 20 in position. Hence, the masking layer will not be patterned with good positioning accuracy. This may produce the problem that the solder bumps 20 connected with the electrodes 5c are damaged or the solder bumps 20 peel off. Accordingly, in the present Embodiment 1, the conductive pattern 17a is disposed between the inner most row of the electrodes 5c and the outermost row of the electrodes 5d to secure a gap greater than the spacing between the adjacent rows. In this illustrated embodiment, there is the outermost row of electrodes 5d in a position spaced from the innermost row of the electrodes 5c by a distance equal to 2 spacings. Furthermore, the conductive pattern 17a formed like a two-dimensional frame is disposed so as to surround a set of the electrodes 5d between the electrodes 5c and 5d. The region of the set of electrodes 5c is clearly separated from the region of a set of electrodes 5d. Because of the structure described above, when the solder resist 15 is partially and selectively removed, wide latitude is offered in aligning the masking layer that covers the solder bumps 20 and so the masking layer can be arranged with high positioning accuracy. Consequently, when the solder resist 15 is partially and selectively removed, it is possible to prevent the problem that the solder bumps 20 connected with the electrodes 5c are damaged or the solder bumps 20 peel off.

The solder bumps 20 are connected with the electrodes 5c but not connected with the electrodes 5d. Therefore, the electrodes 5c and 5d are different in height. Consequently, if the electrodes 5d are disposed between the adjacent ones of the electrodes 5c, it is difficult to place testing probes against the solder bumps 20 and against the electrodes 5d when a test is performed. In contrast, in the present Embodiment 1, the electrodes 5c and 5d are placed in different regions as described above. This makes it easy to place the testing probes against the bumps and electrodes. Accordingly, the testability of the SDRAM within the SiP can be improved.

In the SDRAM, a high-speed operation is performed while synchronizing plural signals. Therefore, it is desired that desired plural interconnects have the same length. Especially, of interconnects which electrically connect the microprocessor of the semiconductor chip 2A and the SDRAM of the semiconductor chip 2B, it is required that the data lines cope with large transfer rates (maximum amounts of data transferred per unit time or maximum frequencies) and that signals in plural data lines be synchronized in a quite short time of nanoseconds. To permit stable operation of the SDRAM, plural interconnects for data signals in the interconnect substrate 1 especially need to have the same length. That is, it is desired that the interconnects 12 for data signals within the interconnect substrate electrically connecting the microprocessor of the semiconductor chip 2A and the SDRAM of the semiconductor chip 2B be equal in length with the interconnects 12 in the interconnect substrate 1 electrically connecting the electrodes 5d. If the electrodes 5d are dispersed in various locations within the plane of the bottom surface of the interconnect substrate 1, it is difficult to make uniform the interconnect lengths from each of the electrodes 5d to each of the interconnects 12 within the interconnect substrate 1 which electrically connect the semiconductor chips 2A and 2B. Accordingly, in the present Embodiment 1, the electrodes 5d are concentrated around the center of the bottom surface of the interconnect substrate 1. Furthermore, the electrodes 5d are arranged in a central area of the bottom surface of the interconnect substrate 1 which is located more inwardly than, and spaced from, the innermost row of the electrodes 5c by a distance equal to or greater than one spacing of the rows. The electrodes 5d are more concentrated in a smaller area. Consequently, the lengths of the interconnects 12 within the interconnect substrate 1 connected with the electrodes 5d can be made uniform. Furthermore, it becomes easy to secure an area in which redundant interconnects for eliminating the differences between the interconnect lengths by providing a large gap between the area where the electrodes 5c are arranged and the area where the electrodes 5d are arranged. That is, the uniformity in length between the interconnects 12 connected with the electrodes 5d can be improved. In particular, the interconnects 12 used for data signals and included in the interconnect substrate 1 electrically connecting the microprocessor of the semiconductor chip 2A and the SDRAM of the semiconductor chip 2B can be made equal in length with the interconnects 12 electrically connecting the electrodes 5d on the bottom surface of the interconnect substrate 1. Therefore, the stability of the operation during a test of operation of the SDRAM can be improved. Hence, the reliability of the test of the operation of the SDRAM can be enhanced. Uniformity in length between the interconnects means, of course, that the physical lengths of the interconnects are equal. In addition, if the interconnects are different in physical length, it can be said that the bare minimum uniformity in length necessary for the interconnects is maintained provided that their lengths are within a range tolerated by the timing margin of the signals flowing into the interconnects. FIG. 8 principally shows the behavior of the interconnects 12 with which the SDRAM of the semiconductor chip 2B is electrically connected. Interconnects for various signals given by pad numbers 1-38 of FIG. 6 and for power supply are arranged from right to left of the upper side of FIG. 8. In addition, interconnects for various signals given by pad numbers 39-81 of FIG. 6 and for power supply are arranged from right to left of the lower side of FIG. 8. The electrodes 5a, 5b, 5c, 5d, interconnects 12, and conductive patterns 17a, 17b are made of copper (Cu), for example. The surfaces of the electrodes 5a, 5b, 5c, and 5d are plated with tin (Sn), for example.

Figure 9:
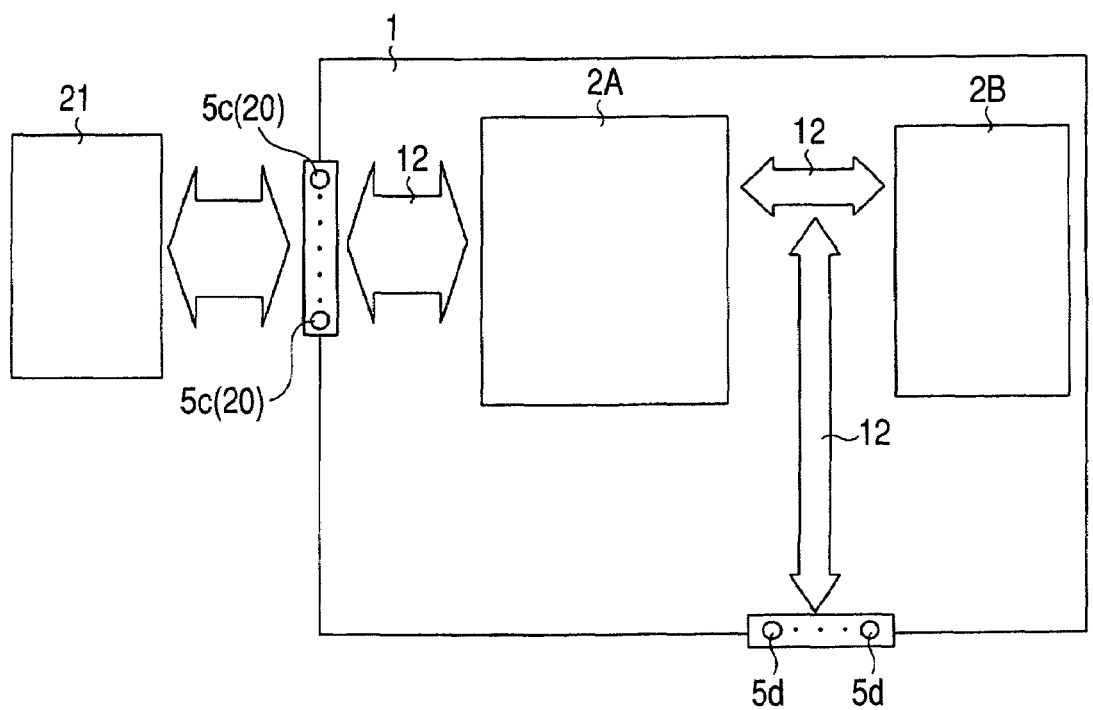
FIG. 9 is a diagram schematically showing the circuit configuration of the semiconductor device shown in FIG. 1.

The circuit configuration of the SiP constructed as described above is schematically shown in FIG. 9. The external interface of the microprocessor of the semiconductor chip 2A is electrically connected with an external LSI (large-scale integrated circuit) 21 sealed in a package different from the SiP through the electrodes 5c. As described above, functional test of the SDRAM of the semiconductor chip 2B, read/write test, and test to know the state of connection can be performed via the electrodes 5c. Furthermore, the memory interface of the microprocessor of the semiconductor chip 2A is electrically connected with the SDRAM of the semiconductor chip 2B through the interconnects 12 of the interconnect substrate 1. In the present Embodiment 1, the interconnects 12 which electrically connect the microprocessor and SDRAM are electrically connected with the electrodes 5d. As described previously, a timing margin test of the SDRAM of the semiconductor chip 2B and a defective location-identifying test can be performed through the electrodes 5d.

Figure 10:
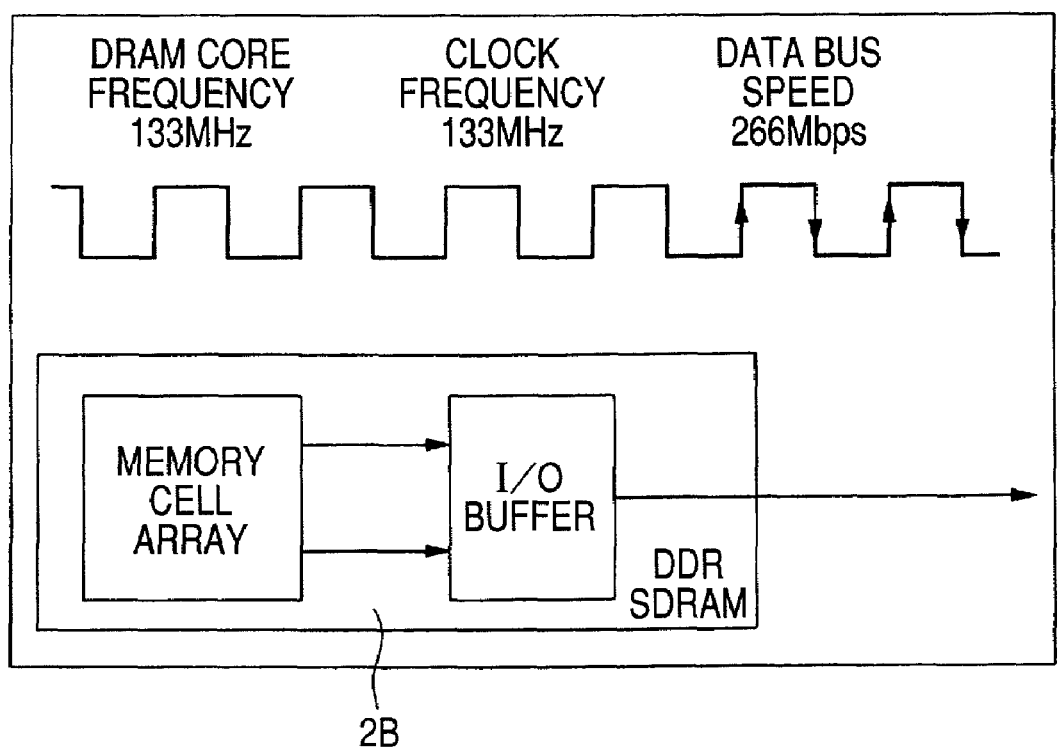
FIG. 10 is a diagram showing one example of a specification of a DDR SDRAM clock interface.

In the above description, the SDRAM is formed in the semiconductor chip 2B. A double data rate (DDR) SDRAM may be formed in the semiconductor chip 2B. A regular SDRAM uses only the rising edges of a clock signal, whereas a DDR SDRAM employs both rising and falling edges of the clock signal to achieve a double data transfer rate for the same clock signal. In the specifications of the DDR SDRAM interface, to achieve high speed of the interface, the timing margin of the data signal (DQ) corresponding to the data strobe signal (DQS) outputted from the memory chip is also severely limited. That is, as shown in FIG. 10, in the interface specifications of the DDR SDRAM that achieves a high rate of data transfer by outputting data in synchronism with the rising and falling edges of the clock signal out of synchronous memories, interconnects for data signals are required to be identical in length with the interconnects for the data strobe signal. Interconnects for data signals are very large in number and connected in parallel to secure a high data transfer rate. In this way, a wide bus bandwidth is acquired. In this way, to achieve the interface specification of the DDR SDRAM, strict timing margin is imposed on an exorbitant number of interconnects. That is, the interconnects need to be equal in length. Accordingly, in this case, of the interconnects 12 in the interconnect substrate 1 electrically connecting the microprocessor of the semiconductor chip 2A with the DDR SDRAM of the semiconductor chip 2B and the interconnects 12 in the interconnect substrate 1 electrically connecting the interconnects 5d, the latter interconnects 12 for data signals are made equal in length. In addition, the interconnects 12 for data signals and the interconnects 12 for data strobe signals are also made equal in length. This can enhance the reliability of evaluation, test, and defect analysis of the DDR SDRAM.

An example of a method of fabricating the semiconductor device of the present Embodiment 1 is next described with reference to FIGS. 11 and 12-18.

Figure 11:
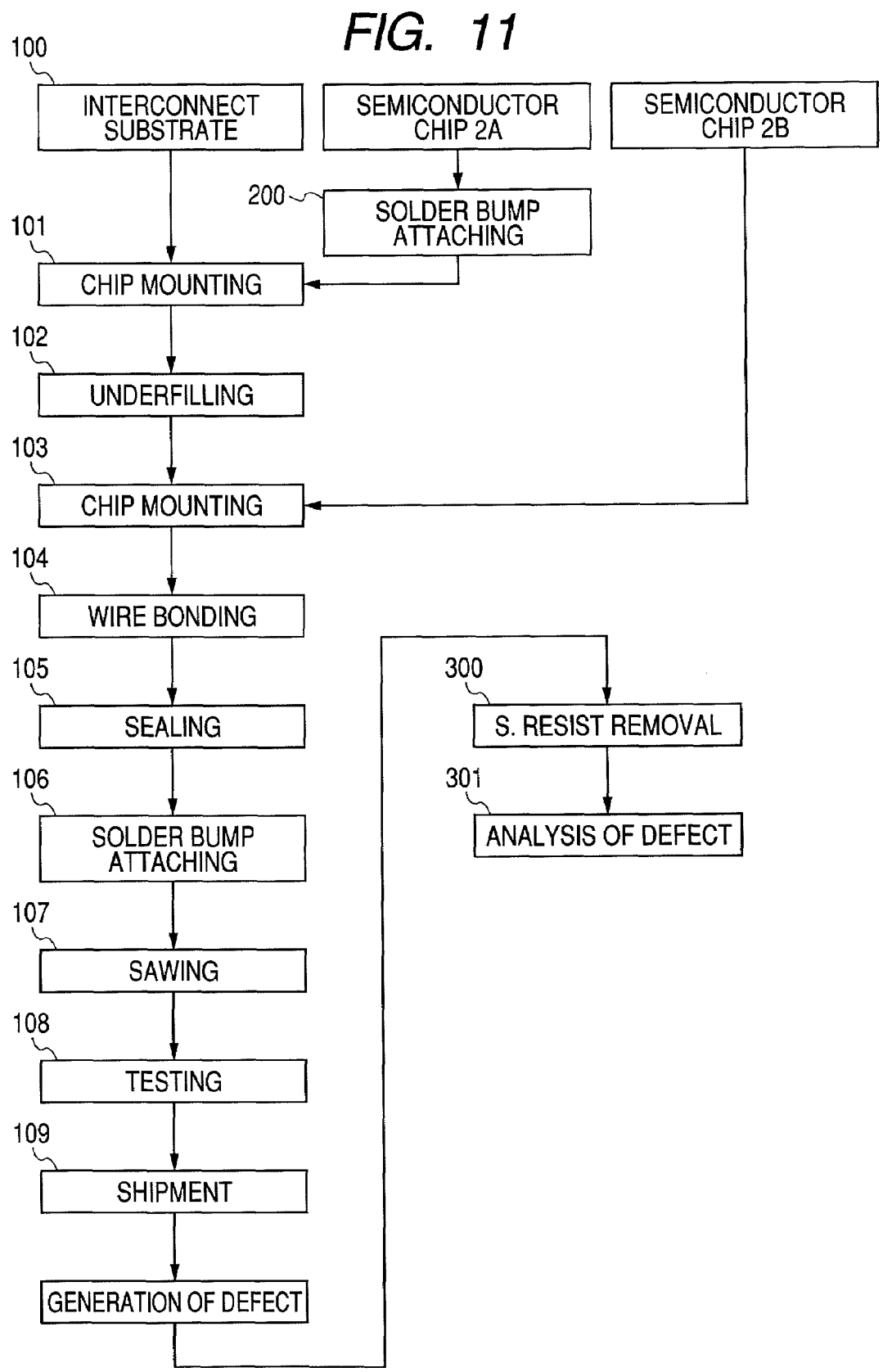
FIG. 11 is a flowchart illustrating an example of a fabrication sequence of the semiconductor device shown in FIG. 1.
Figure 12:
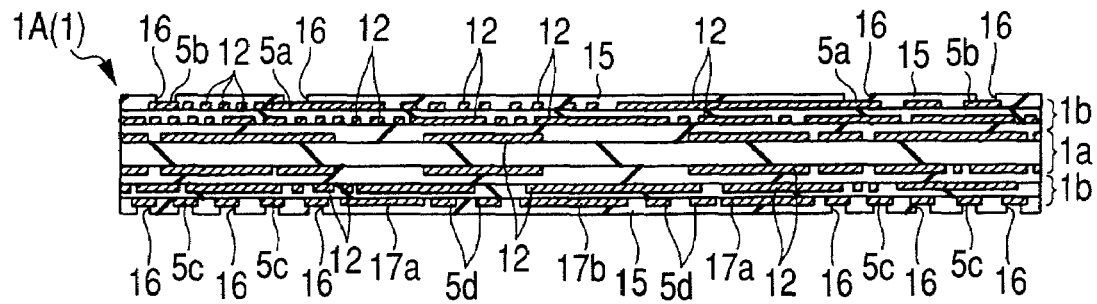
FIG. 12 is a cross-sectional view of a unit area of a substrate matrix for forming an interconnect substrate that constitutes the semiconductor device shown in FIG. 1.

First, as shown in FIG. 12, a substrate matrix 1A for the interconnect substrate 1 is prepared (step 100 of FIG. 11). FIG. 12 is a cross-sectional view of a unit region (region corresponding to one SiP) of the substrate matrix 1A forming the interconnect substrate 1. Solder resist 15 is coated on the upper and lower surfaces of the substrate matrix 1A. Openings 16 for exposing the surfaces of plural electrodes 5a, 5b, and 5c are formed in parts of the surfaces. The electrodes 5d are coated with the solder resist 15.

Figure 13:
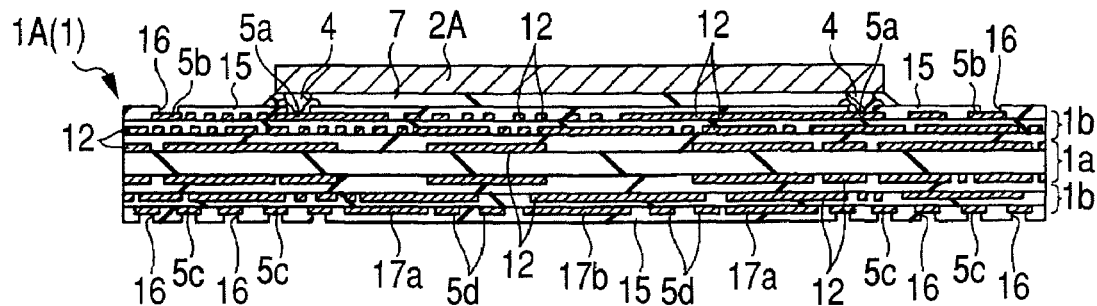
FIG. 13 is a cross-sectional view of a unit of area of a substrate matrix for forming an interconnect substrate during fabrication sequence of the semiconductor device shown in FIG. 1.

Subsequently, as shown in FIG. 13, a semiconductor chip 2A is mounted on each unit area of the substrate matrix 1A (step 101 of FIG. 11). Underfill resin 7 is filled in between the opposite surfaces of each semiconductor chip 2A and the substrate matrix 1A (step 102 of FIG. 11). FIG. 13 is across-sectional view of a unit area of the substrate matrix 1A after the step 102. In the step of mounting each semiconductor chip 2A, solder bumps 4 are connected with the pads on the main surface of the semiconductor chip 2A (step 200 of FIG. 11). Then, the main surface of the chip 2A on which devices and solder bumps will be formed is faced toward the upper surface of the substrate matrix 1A. The solder bumps 4 of the chip 2A are connected with the electrodes 5a of the substrate matrix 1A.

Figure 14:
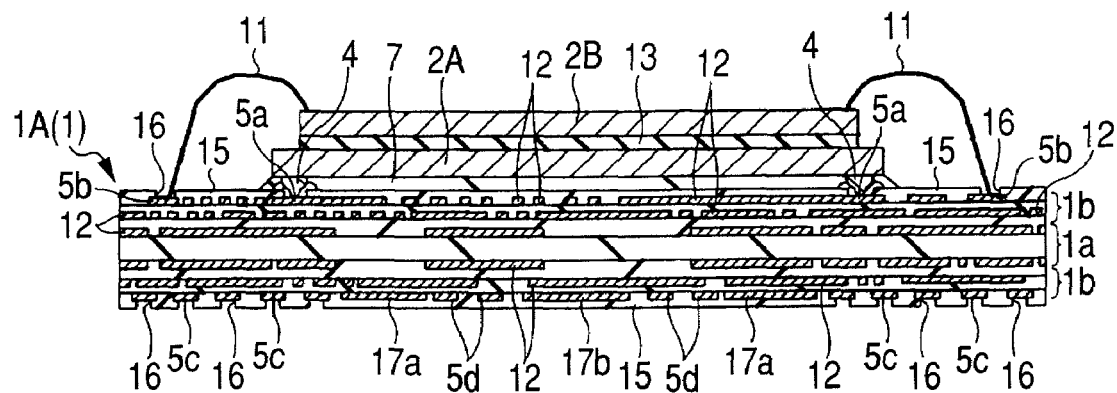
FIG. 14 is a cross-sectional view of a unit of area of a substrate matrix for forming an interconnect substrate during fabrication sequence of the semiconductor device, which is subsequent to the steps illustrated in FIG. 13.

Then, as shown in FIG. 14, semiconductor chips 2B are mounted on the rear surfaces of the semiconductor chips 2A in the unit areas of the substrate matrix 1A via the adhesive 13 (step 103 of FIG. 11). Then, pads 9 of the semiconductor chips 2B are connected with the electrodes 5b of the substrate matrix 1A by wires 11 (step 104 of FIG. 11). FIG. 14 is across-sectional view of a unit area on the substrate matrix 1A after this step. Each semiconductor chip 2B is mounted in such a way that the main surface on which devices and pads will be formed faces upward.

Subsequently, the plural semiconductor chips 2A and 2B on the substrate matrix 1A are simultaneously sealed in molding resin 3 consisting, for example, of epoxy-based resin using a transfer molding process, for example (step 105 of FIG. 11). Then, solder bumps 20 are simultaneously connected with the electrodes 5c of the unit areas on the bottom surface of the substrate matrix 1A (step 106 of FIG. 11). Thereafter, the substrate matrix 1A is sawn into the individual unit areas to fabricate semiconductor devices (step 107 of FIG. 11). Then, tests such as electrical characteristics test and visual test are performed on each semiconductor device (step 108 of FIG. 11). Then, the semiconductor devices are shipped (step 109 of FIG. 11).

Figure 15:
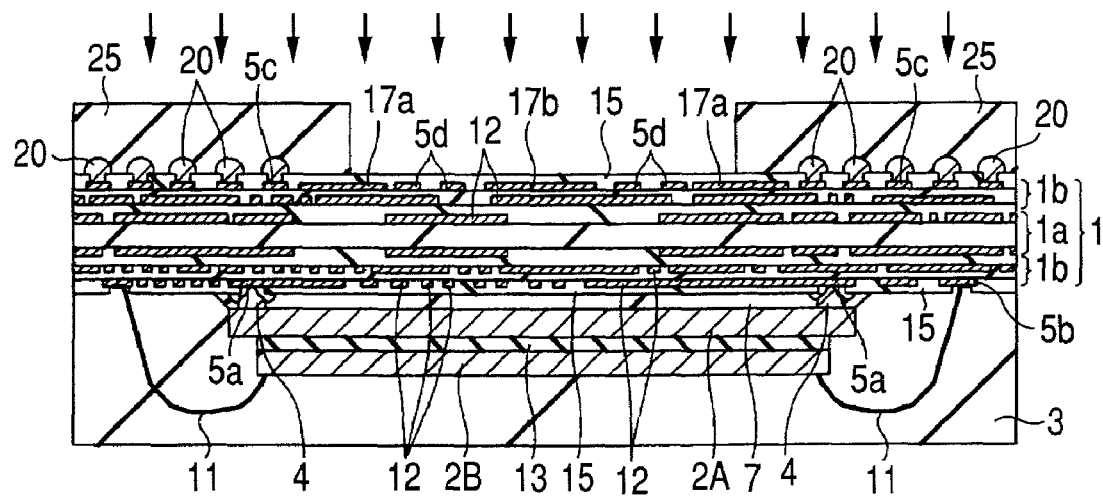
FIG. 15 is a cross-sectional view of the semiconductor device shown in FIG. 1, illustrating a process step for removing the insulating layer on the top-level layer of the interconnect substrate constituting the semiconductor device of FIG. 1.
Figure 16:
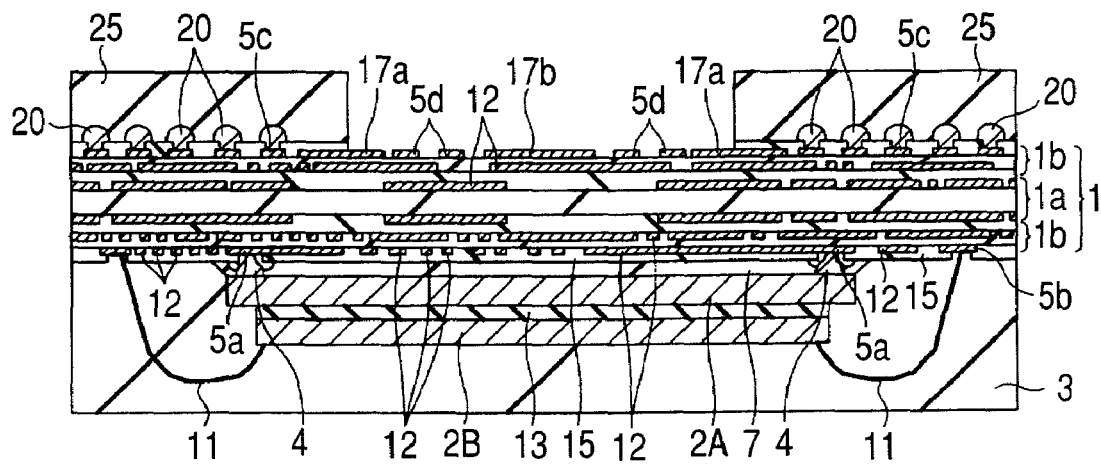
FIG. 16 is a cross-sectional view of the semiconductor device illustrating a step subsequent to the step illustrated in FIG. 15, yet illustrating the process step for removing the insulating layer.

In a case where a defect occurs after the shipment, the defective product is recovered, and the cause of the defect is analyzed. In this embodiment, as shown in FIG. 15, a masking layer 25 is first formed on the bottom surface of the interconnect substrate 1 so as to cover the solder bumps 20. Then, using this layer as a removal mask, the solder resist 15 is partially and selectively removed by an ashing process using a plasma of a gas (such as oxygen ($O_2$)) as shown in FIG. 16 (step 300 of FIG. 11). FIGS. 15 and 16 are cross-sectional views of one semiconductor device during the step of removing the solder resist 15. In the present Embodiment 1, as described previously, the conductive pattern 17a is disposed between the innermost row of the electrodes 5c and the outermost row of the electrodes 5d, and a gap of at least one spacing between the rows is formed. This can offer wide allowance in aligning the masking layer that covers the solder bumps 20. Therefore, the masking layer can be placed with high positioning accuracy. Consequently, when the solder resist 15 is partially and selectively removed, it is possible to prevent the problem that the solder bumps 20 connected with the electrodes 5c are damaged or the bumps 20 peel off. Formation of the wide conductive patterns 17a and 17b can protect the underlying insulating layer and interconnects 12 against ashing damage. In consequence, the reliability of tests of the SDRAM can be secured.

Figure 17:
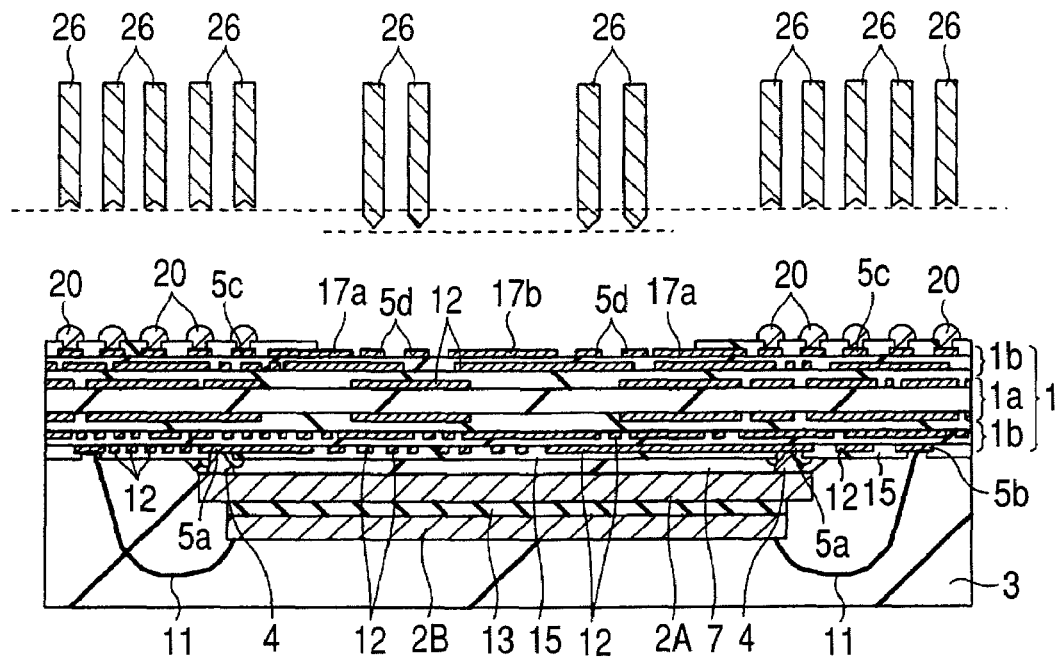
FIG. 17 is a cross-sectional view of the semiconductor device under the condition where it is mounted to testing equipment.
Figure 18:
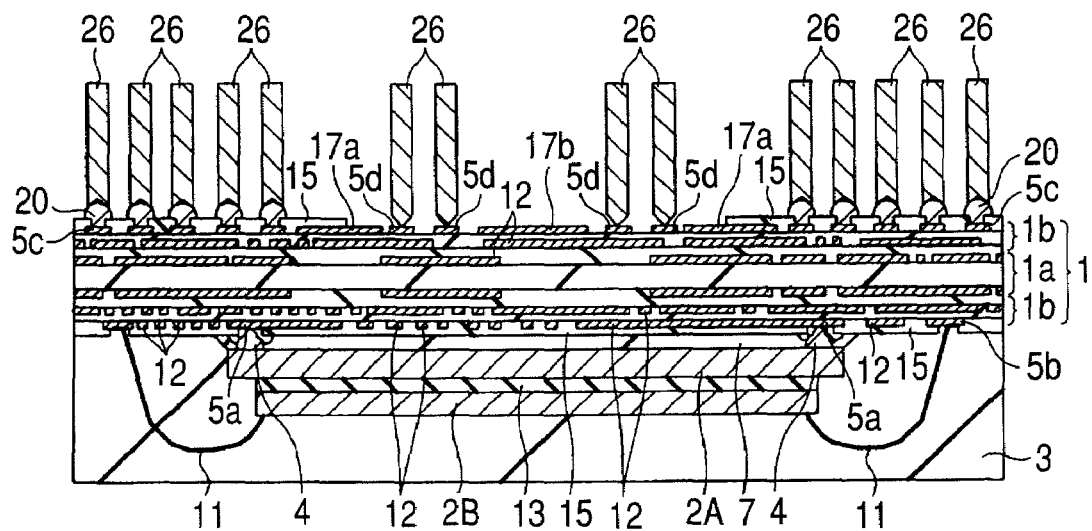
FIG. 18 is a cross-sectional view of the semiconductor device under the condition where a test is performed.

Subsequently, the masking layer 25 is removed. Then, each semiconductor device is placed on testing equipment. Then, as shown in FIG. 17, probes 26 of the testing equipment are placed in position relative to the solder bumps 20 and electrodes 5d of the semiconductor device. FIG. 17 is a cross-sectional view of the semiconductor device when it is mounted on the testing equipment. The tip of the probe 26 placed against each electrode 5d is convex, while the tip of the probe 26 placed against each solder bump 20 is concave. Before the stage of making contact shown in FIG. 17, the position of the tip of the probe 26 placed against the central electrode 26 protrudes (in a direction approaching the bottom surface of the interconnect substrate 1) below the position of the tip of the probe 26 placed against one solder bump 20 on the outer periphery. The difference between the positions of the tips of the probes 26 is to accommodate the difference in height between the electrode 5d and solder bump 20. Subsequently, as shown in FIG. 18, the probes 26 are descended to bring their tips into contact with the plural solder bumps 20 and electrodes 5d. Under this condition, various tests such as timing margin test and defect location determination test are performed to analyze the defect (step 301 of FIG. 11). FIG. 18 is a cross-sectional view of the semiconductor device when it is tested. At this time, in the present Embodiment 1, the plural electrodes 5c and the plural electrodes 5d are arranged in different areas as described above. This makes it easy to place the testing probes against the electrodes. Hence, the testability of the SDRAM within the SiP can be improved. Furthermore, the uniformity in length between the interconnects 12 within the interconnect substrate 1 which are connected with the electrodes 5d can be improved. Consequently, the stability of operation during an operation test of the SDRAM can be improved. As a result, the reliability of the operation test and defect analysis of the SDRAM can be enhanced.

Embodiment 2

Figure 19:
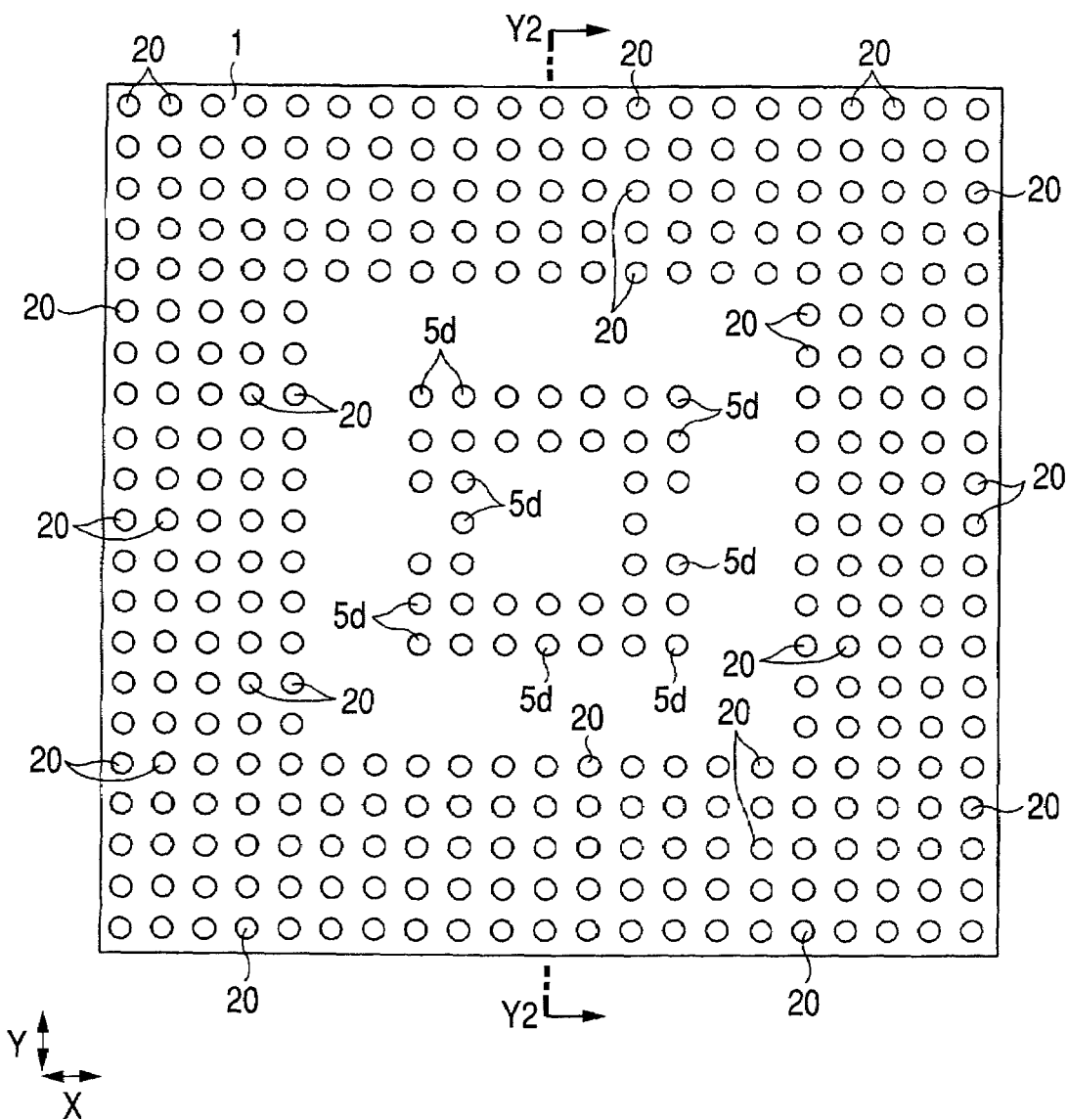
FIG. 19 is a plan view of the bottom surface of a semiconductor device that is another embodiment of the present invention.
Figure 20:
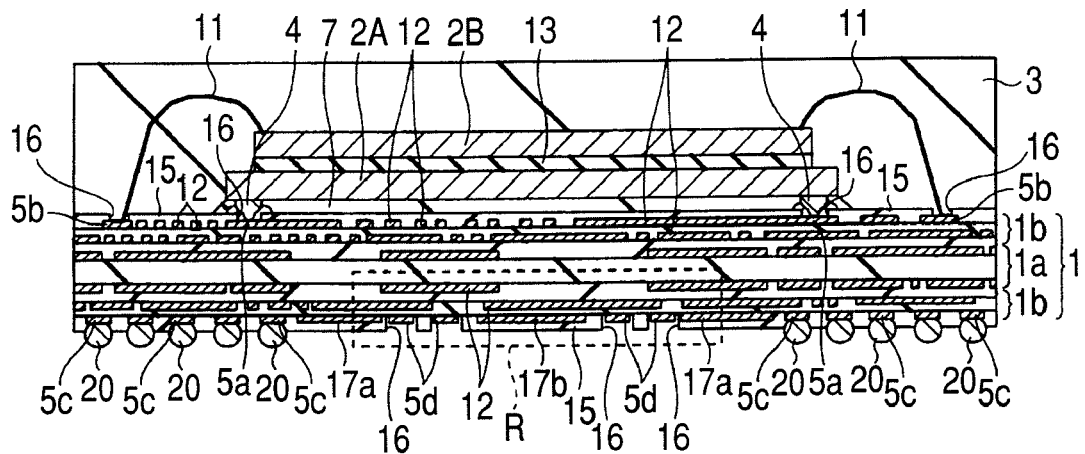
FIG. 20 is a cross-sectional view taken on line Y2-Y2 of FIG. 19.
Figure 21:
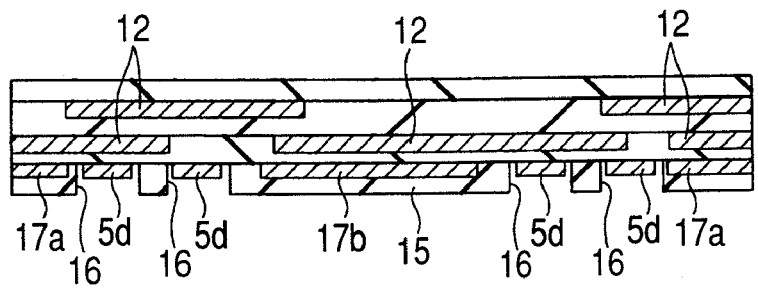
FIG. 21 is an enlarged cross section of an area R of FIG. 20.
Figure 22:
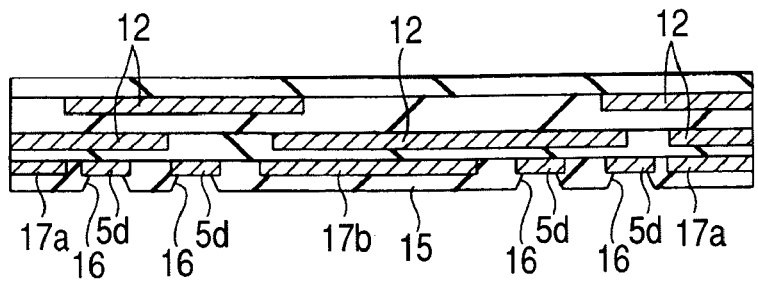
FIG. 22 is a cross-sectional view of a modification of the structure shown in FIG. 21.

FIG. 19 is a plan view of the bottom surface of a semiconductor device of the present Embodiment 2. FIG. 20 is a cross-sectional view taken on line Y2-Y2 of FIG. 19. FIG. 21 is an enlarged cross section of an area R of FIG. 20. FIG. 22 is a cross-sectional view of a modification of the device shown in FIG. 21.

In the present Embodiment 2, the surfaces of the electrodes 5d on the bottom surface of the interconnect substrate 1 of the semiconductor device are exposed from the solder resist 15. Openings 16 in which the electrodes 5d are exposed are formed simultaneously with when openings 16 in which the electrodes 5c are exposed are formed.

One method of exposing the electrodes 5d is to place the opening ends of the solder resist 15 remotely from the outer peripheries of the electrodes 5d such that the opening ends do not reach the outer peripheries (non solder mask defined (NSMD)) as shown in FIG. 21. Alternatively, the opening ends of the solder resist 15 may reach the outer peripheries of the electrodes 5d (solder mask defined (SMD)) as shown in FIG. 22. Where the electrodes 5d are exposed in this way, the solder bumps 20 may be connected with the electrodes 5d.

In the case of the present Embodiment 2, in a case where a defect occurs after finished products have been shipped and an analysis of the defect is performed, it is not necessary to remove the solder resist 15. Therefore, the process sequence can be simplified. Furthermore, during development of a commercial product, the SDRAM is tested after fabrication of the semiconductor device and so it is desirable to use a structure in which the electrodes 5d are exposed in the same way as in the configuration of the present Embodiment 2.

While the invention made by the present inventor has been described in detail so far based on its embodiments, it is obvious that the present invention is not limited to the above embodiments and that various changes and modifications are possible within the scope of the gist.

For example, the SiP can be fabricated by stacking the semiconductor chip 2A on the semiconductor chip 2B in which the SDRAM is formed, the chip 2A having a built-in microprocessor.

In addition, passive elements (small-sized electronic parts) other than semiconductor chips such as capacitors and resistive elements may be mounted on the interconnect substrate, as well as the semiconductor chips 2A and 2B. For example, noise produced when driving the SDRAM is reduced and a higher-speed operation can be achieved by installing chip capacitors along the outer periphery of the semiconductor chip in which the SDRAM is formed.

In the description provided so far, the invention made by the present inventor is chiefly applied to a cell phone that forms a field of utilization constituting the background of the invention. The invention is not limited thereto. The invention can also be applied to a mobile information processing device (such as a PDA (personal digital assistant) or an information processing device such as a personal computer.

The present invention can be applied to the semiconductor device manufacturing industry.

What is claimed is:

1. A semiconductor device comprising:
a wiring substrate having a main surface, a back surface opposing to the main surface, a plurality of first electrodes formed on the main surface, a plurality of second electrodes formed on the main surface, a plurality of first external terminals formed on the back surface, and a plurality of second external terminals formed on the back surface, wherein the plurality of second electrodes are arranged closer to a periphery of the main surface of the wiring substrate than the plurality of first electrodes are, and wherein the plurality of second external terminals are arranged closer to a periphery of the back surface of the wiring substrate than the plurality of first external terminals are;
a first semiconductor chip having a first upper surface, a first rear surface opposing to the first upper surface, and a plurality of bump electrodes formed on the first upper surface, wherein the plurality of bump electrodes are connected with the plurality of first electrodes, respectively, and wherein the first semiconductor chip is mounted over the wiring substrate through the plurality of bump electrodes in such a manner that the first upper surface of the first semiconductor chip is opposed to the main surface of the wiring substrate;
a second semiconductor chip having a second upper surface, a second rear surface opposing to the second upper surface, and a plurality of electrode pads formed on the second upper surface, wherein the second semiconductor chip is mounted over the first semiconductor chip through an adhesive in such a manner that the second rear surface of the semiconductor chip is opposed to the first rear surface of the first semiconductor chip;
a plurality of wires electrically connected to the plurality of electrode pads of the second semiconductor chip with the plurality of second electrodes, respectively;
a sealing body sealing the main surface of the wiring substrate, the first semiconductor chip, the second semiconductor chip and the plurality of wires; and
a plurality of solder bumps formed on the plurality of second external terminals of the wiring substrate, respectively, wherein the plurality of solder bumps are not formed on the plurality of first external terminals of the wiring substrate.

2. A semiconductor device comprising:
a wiring substrate having a main surface, a back surface opposing to the main surface, a plurality of first electrodes formed on the main surface, a plurality of second electrodes formed on the main surface, a plurality of first external terminals formed on the back surface, a plurality of second external terminals formed on the back surface, a first insulating layer formed over the main surface, and a second insulating layer formed over the back surface, wherein the plurality of second electrodes are arranged closer to a periphery of the main surface of the wiring substrate than the plurality of first electrodes are, wherein the plurality of second external terminals are arranged closer to a periphery of the back surface of the wiring substrate than the plurality of first external terminals are, wherein the plurality of first electrodes and the plurality of second electrodes are exposed from the first insulating layer, wherein the plurality of first external terminals are covered with the second insulating layer, and wherein the plurality of second external terminals are exposed from the second insulating layer;
a first semiconductor chip having a first upper surface, a first rear surface opposing to the first upper surface, and a plurality of bump electrodes formed on the first upper surface, wherein the plurality of bump electrodes are connected with the plurality of first electrodes, respectively, and wherein the first semiconductor chip is mounted over the wiring substrate through the plurality of bump electrodes in such a manner that the first upper surface of the first semiconductor chip is opposed to the main surface of the wiring substrate;
a second semiconductor chip having a second upper surface, a second rear surface opposing to the second upper surface, and a plurality of electrode pads formed on the second upper surface, wherein the second semiconductor chip is mounted over the first semiconductor chip through an adhesive in such a manner that the second rear surface of the semiconductor chip is opposed to the first rear surface of the first semiconductor chip;

a plurality of wires electrically connected to the plurality of electrode pads of the second semiconductor chip with the plurality of second electrodes, respectively;

a sealing body sealing the main surface of the wiring substrate, the first semiconductor chip, the second semiconductor chip and the plurality of wires; and a plurality of solder bumps formed on the plurality of second external terminals of the wiring substrate, respectively, wherein the plurality of solder bumps are not formed on the plurality of first external terminals of the wiring substrate.

3. The semiconductor device according to claim 2, wherein the first semiconductor chip includes a circuit controlling the second semiconductor chip, and wherein the second semiconductor chip includes a memory circuit.

4. The semiconductor device according to claim 2, wherein the plurality of bump electrodes are sealed with an under-fill resin.

* * * * *